United States Patent [19]

Matsumoto

[11] Patent Number: 5,327,463
[45] Date of Patent: Jul. 5, 1994

[54] INTEGRATED CIRCUIT DEVICE FOR RS-232C LINE RECEIVER

[75] Inventor: Yoichi Matsumoto, Tokyo, Japan

[73] Assignee: Nec Corporation, Japan

[21] Appl. No.: 675,533

[22] Filed: Mar. 25, 1991

[30] Foreign Application Priority Data

Mar. 28, 1990 [JP] Japan .................... 2-79891

[51] Int. Cl.$^5$ ............................................. H04L 25/06
[52] U.S. Cl. ........................................ 375/76; 375/36; 307/355
[58] Field of Search ................ 307/355, 358, 360, 361, 307/362; 375/36, 76; 328/115, 116

[56] References Cited

U.S. PATENT DOCUMENTS 3,725,673  4/1973  Frederiksen et al. ................. 307/362
4,516,247  5/1985  Carsalade et al. ..................... 375/56
4,634,897  1/1987  Yoshioka ............................. 307/355

FOREIGN PATENT DOCUMENTS 173912  7/1989  Japan .

Primary Examiner—Stephen Chin
Assistant Examiner—T. Ghebretinsae
Attorney, Agent, or Firm—Laff, Whitesel, Conte & Saret

[57] ABSTRACT

An RS-232C line receiver IC includes a reference voltage generating circuit, a switching circuit, a switch control circuit and a hysteresis output circuit. The reference voltage generating circuit produces a first low reference voltage at a node and a second low reference voltage at a node. The switching circuit has a first and a second switching device connected respectively to the nodes of the reference voltage generating circuit. The switch control circuit selectively makes conductive the first or the second switching device. The hysteresis output circuit to which an input is applied is connected to the first and second switching devices and receives the first or second low reference voltage applied through the first or the second switching device as low input threshold voltages. Selection can be made either for threshold characteristics with a high noise margin and a low error rate for transmitting a high speed clock signal, or for threshold characteristics, which can determine the receiver output state when the input is disconnected and can prevent malfunction of the system, for transmitting a control signal.

2 Claims, 2 Drawing Sheets

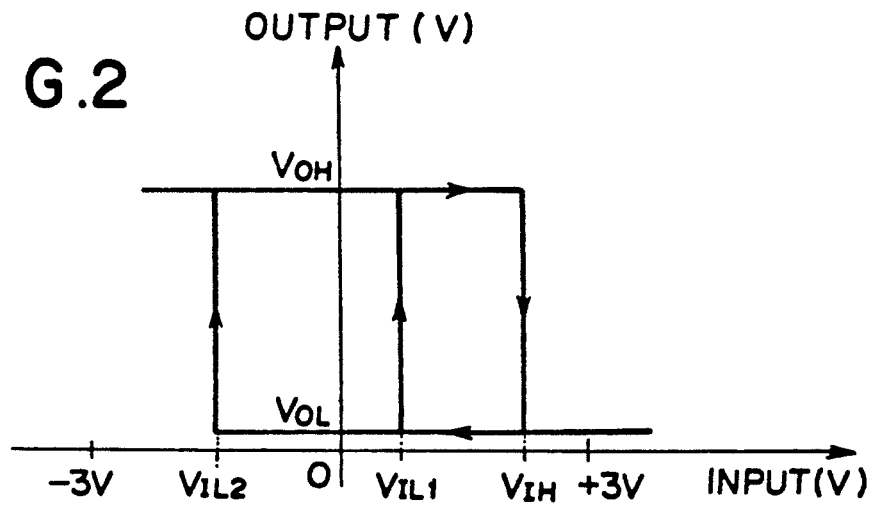
F I G. 2

INTEGRATED CIRCUIT DEVICE FOR RS-232C LINE RECEIVER

BACKGROUND OF THE INVENTION

The present invention relates to an integrated circuit device for RS-232C line receiver and, more particularly, to an integrated circuit device for RS-232C line receiver (hereinafter referred to as "RS-232 line receiver IC") conforming to the RS-232C standards for a digital data transmission system through an electric cable.

As a type of conventional line receiver IC conforming to the RS-232C standards, the line receiver IC shown in FIG. 3 is the most typical. In such conventional type RS-232C line receiver IC, the hysteresis width is determined by a feedback resistor and the input threshold is fixed. Therefore, although the characteristics of optimal input threshold for transmitting a high speed clock signal are different from those for transmitting a control signal, either of the characteristics must be sacrificed, which is a disadvantage as explained later.

SUMMARY OF THE INVENTION

It is, therefore, an object of the present invention to provide an improved RS-232C line receiver IC.

It is another object of the invention to provide an RS-232C line receiver IC which has two different low input threshold voltages which can be selected depending on the types of the signal to be transmitted, one for transmitting a high speed clock synchronizing signal with a high noise margin and the other for transmitting a control signal.

According to one aspect of the invention, there is provided an integrated circuit device for an RS-232C line receiver for digital data transmission through an electric cable, having hysteresis characteristics in changes of an output voltage with respect to an input voltage, and conforming to the RS-232C standards, the line receiver IC comprises:

a reference voltage generating circuit having a first reference voltage generating means for producing a first low reference voltage and a second reference voltage generating circuit for producing a second low reference voltage;

a switching circuit having a first switching means an end of which is connected to the second reference voltage generating means and a second switching means an end of which is connected to the first reference voltage generating means;

a switch control circuit which selectively makes conductive the first switching means or the second switching means; and a hysteresis output circuit to which the other ends of the first switching means and the second switching means are commonly connected and to which the input voltage is applied, and which receives the first or second reference voltage applied through the first switching means or the second switching means as low input threshold voltages.

The receiver according to this invention is provided with various controlling means for altering threshold characteristics so that, depending on whether the signal to be transmitted is a clock synchronizing signal or a control signal, selection can be made either for threshold characteristics with a high noise margin and a low error rate for transmitting a high speed clock signal, or for threshold characteristics, which can determine the receiver output state when the input is disconnected and can prevent malfunction of the system, for transmitting a control signal.

BRIEF DESCRIPTION OF THE DRAWINGS

The above and other objects, features and advantages of the present invention will be apparent from the following description of preferred embodiments of the invention explained with reference to the accompanying drawings, in which:

FIG. 2 shows the input threshold characteristics of the embodiment shown in FIG. 1;

PREFERRED EMBODIMENTS OF THE INVENTION

Throughout the following explanation, similar reference symbols or numerals refer to the same or similar elements in all figures of the drawings.

For the purpose of assisting in the understanding of the present invention, a conventional RS-232C line receiver IC will first be described by making reference to FIGS. 3 and 4 before the present invention is explained.

Figure 3:
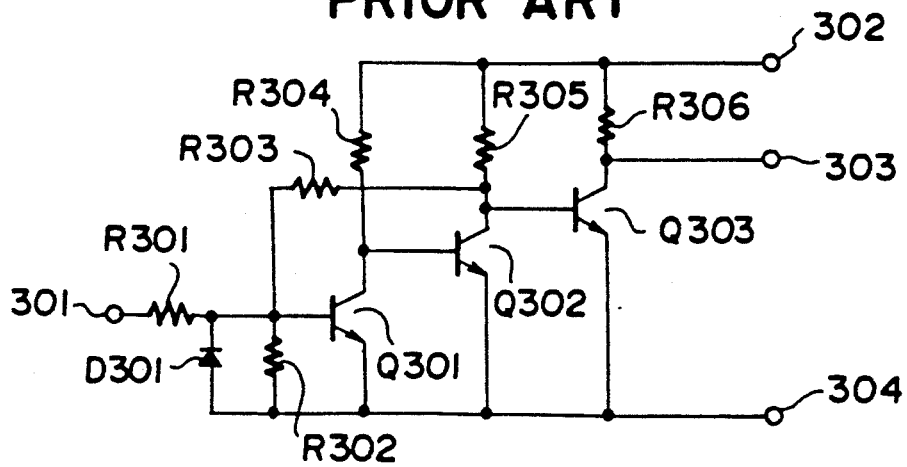
FIG. 3 shows a circuit diagram of an example of a conventional RS-232C line receiver IC.

The conventional circuit shown in FIG. 3 comprises NPN transistors Q301, Q302, Q303, resistors R301 through R306, a receiver input terminal 301, a VCC terminal 302, a receiver output terminal 303, a ground terminal 304, and a diode D301.

Operation of the circuit is described below.

When an input signal applied to the receiver input terminal 301 is of a high level, the transistor Q301 is turned ON, while the transistor Q302 is OFF and the transistor Q303 is ON, and thus a level at the receiver output terminal 303 is low. Then, when an input level changes from high to low, the transistor Q301 is turned OFF, while the transistor Q302 is turned ON and the transistor Q303 is turned OFF, and thus the level at the output terminal 303 changes from low to high. The input voltage $V_{IN(L-H)}$ then is expressed as shown below, assuming that the base to emitter voltage of the input transistor Q301 is 0.6 V.

$$V_{IN(L-H)} = \frac{R301 + R302}{R302} \cdot 0.6$$

Also, the input voltage $V_{IN(H-L)}$ when input signal level changes from low to high with the transistor Q301 turning ON and the output level changing from high to low is expressed in the following equation.

$$V_{IN(H-L)} = \frac{R303 + \frac{R302 \cdot R303}{R302 + R303}}{\frac{R302 \cdot R303}{R303 + R303}} \cdot 0.6$$

Figure 4:
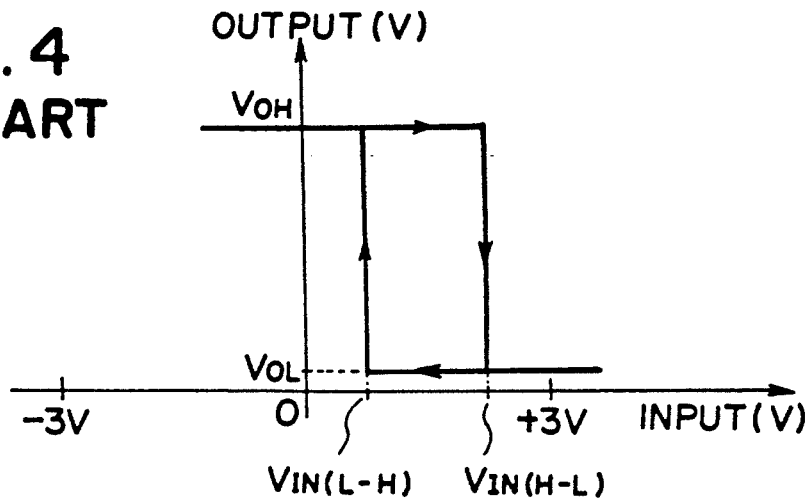
FIG. 4 shows the input threshold characteristics of the example shown in FIG. 3.

Thus, the high to low input voltage $V_{IN(H-L)}$ is larger than the low to high input voltage $V_{IN(L-H)}$, and the line receiver IC shown in FIG. 3 has, as shown in FIG. 4, threshold characteristics accompanied with a hysteresis width. Note that the hysteresis width is determined by the resistance value of the feedback resistor R303.

In the conventional RS-232C line receiver IC as described above, the hysteresis width is determined by the feedback resistor R303 and the input threshold is fixed, so that, in an actual application, in spite of the fact that, for instance, the optimal input threshold for transmitting a high speed clock signal is different from that for transmitting a control signal, either one of the characteristics is unavoidably be sacrificed, which is a disadvantage as explained below in detail.

Signals transmitted through an RS-232C interface are classified into two types, a high speed signal synchronized to a clock signal and a low speed control signal. The input threshold characteristics required by a line receiver IC should be changed according to the types of signal to be transmitted, for the reasons as described below.

One of the reasons is the hysteresis width characteristics with respect to the frequency of the signal to be transmitted, and, for example, as the signal speed becomes higher, wider hysteresis width is required to raise the noise margin. Another factor to be considered is the output state when a connector is pulled off and the input is disconnected. When the input is disconnected, the input level is zero (0 V) because of the resistor R302 shown in FIG. 3, if 0 V is included in the range of hysteresis width, the output state will become unstable. This phenomenon is undesirable for transmitting a control signal because it may cause malfunction of the system. In other words, as a wide hysteresis width is required for improving the noise margin when transmitting a high speed clock synchronizing signal, and additionally since an unstable receiver output is possible when the connector is pulled off, it is better to employ a wide hysteresis width including 0 V in the input threshold width range from $-3$ V to $+3$ V, which is specified in the RS-232C standards. On the other hand, as noise margins may be wide when transmitting a low speed control signal, a wide hysteresis width like that for transmitting a clock synchronizing signal is not required, but it is necessary that the receiver output does not become unstable when the connector is pulled off and an input is disconnected. For this reason, the hysteresis width cannot include 0 V in the input threshold width range from $-3$ V to $+3$ V which is specified in the RS-232C standards.

In the conventional line receiver IC based on the RS-232C standards, as one IC can operates at only one input threshold as described above, it is usual that a threshold characteristics matched to the control signal is preset. Specifically, as to such a type of RS-232C line receiver, it has input threshold characteristics matched to control signals and having a narrow hysteresis width, as shown in FIG. 4, which does not include 0 V. Thus, if a high speed clock synchronizing signal is transmitted, the noise margin is inadequate, and sometimes a transmission error may occur. Even if a line receiver IC having a wide hysteresis width which includes 0 V is developed for transmitting a clock synchronizing signal, it cannot be used for transmitting a control signal because of the reason as described above. Thus, two types of IC must be used in practical use, which is very inconvenient.

According to the present invention, the line receiver IC is characterized in that it comprises a means for generating a first reference voltage; a means for generating a second reference voltage, a first and a second switching means; an end of each of which is connected to said means for generating the first and the second reference voltage respectively; a switch control means which selectively make conductive said first switching means or said second switching means; and a hysteresis output circuit to which the other ends of said first and second switching means are connected and to which said input voltage is applied, and which receives said first or second reference voltage applied through said first or second switching means as the input threshold voltage.

The line receiver IC according to the present invention is capable of changing input thresholds in one IC by having the switch control means operated to cause either the first or second switching means to become conductive selectively and having either the first or second reference voltage inputted to the hysteresis output circuit, and this feature enables the selection of optimal threshold characteristics suited to a signal to be transmitted depending on whether the signal to be transmitted is a clock synchronizing signal or a control signal.

An embodiment of this invention is described below with reference to the appended drawings.

Figure 1:
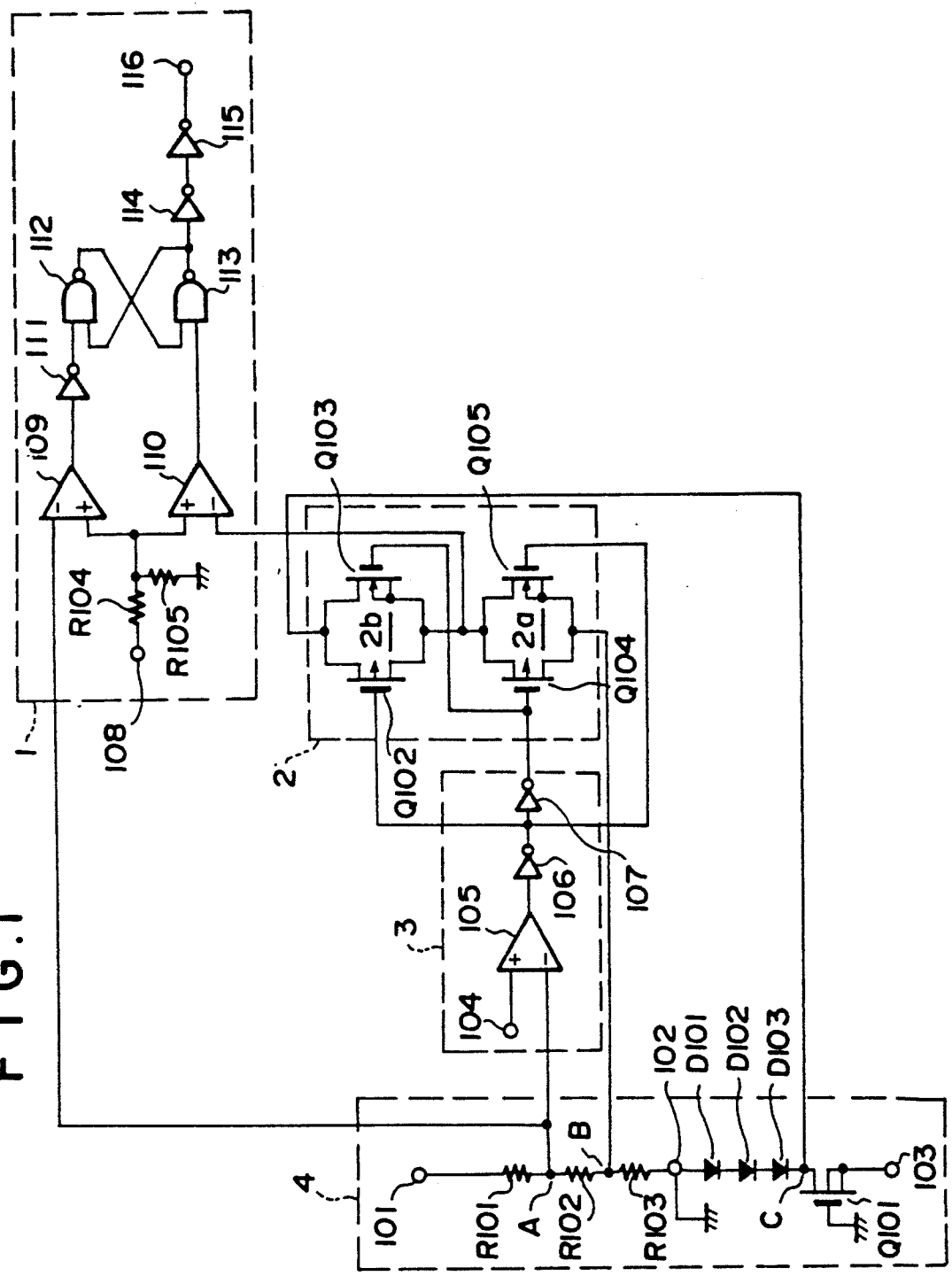
FIG. 1 shows a circuit diagram for an embodiment of the RS-232C line receiver according to the invention.

FIG. 1 is a circuit diagram showing an embodiment of an RS-232C line receiver IC according to this invention.

The line receiver IC of the invention comprises a hysteresis output circuit 1, a switch circuit 2, a switch control circuit 3, and a reference voltage generating circuit 4. The hysteresis output circuit 1 comprises a receiver input terminal 108, resistors R104, R105, comparators 109, 110, a flip-flop consisting of NAND gates 112, 113, inverters 111, 114, 115 and a receiver output terminal 116. The switch circuit 2 has a first transmission gate 2a comprising a PMOS FET Q104 and an NMOS FET Q105 connected in parallel, and a second transmission gate 2b comprising a PMOS FET Q102 and an NMOS FET Q103 connected in parallel. The switch control circuit 3 comprises a threshold select terminal 104, a threshold selection input comparator 105, and inverters 106, 107. The reference voltage generating circuit 4 comprises a VCC terminal 101, a ground terminal 102, resistors R101 through R103 connected in series between the VCC terminal 101 and the ground terminal 102, diodes D101 through D103 connected in series between the ground terminal 102 and the VSS terminal 103, and a MOS transistor Q101 having its gate grounded. In this reference voltage generating circuit 4, the voltage at point A which is a junction node between the resistors R101 and R102 is a high level threshold voltage $V_{IH}$ for the receiver IC and a comparison reference voltage for the threshold select terminal 104 of the input comparator 105, and the voltage at point B which is a junction node between the resistors R102 and R103 is a low level threshold voltage $V_{IL1}$ of the receiver IC for the transmission of the control signals. The voltage developed at point C between the cathode of the diode D103 and the MOS transistor Q101 is a low level threshold voltage $V_{IL2}$ for clock signals.

When a voltage applied to the threshold select terminal 104 is higher than $V_{IH}$ (potential at point A), an output from the comparator 105 goes high, while an output from the inverter 106 goes low, and an output from the inverter 107 goes high. Because of this feature, the transistors Q102 and Q103 forming the second transmission gate 2b are turned ON while the transistors Q104 and Q105 forming the first transmission gate 2a are turned OFF, and the voltage at point C, namely $V_{IL2}$, is applied to the inversion input terminal of the comparator 110 which determines the low level threshold voltage in the receiver. On the contrary, when the voltage applied to the threshold select terminal 104 is lower than that at point A ($V_{IH}$), the output from the comparator 105 goes low while the output from the inverter 106 goes high and the output from the inverter 107 goes low, and the transistors Q102 and Q103 of the second transmission gate 2b are turned OFF and the transistors Q104 and Q105 of the first transmission gate 2a are turned ON, and the voltage ($V_{IL1}$) at point B is applied to the inversion input terminal of the comparator 110 which determines the low level threshold voltage in the receiver.

When the receiver input voltage applied to the terminal 108 is higher than the threshold voltage being applied to the inversion input terminals of the comparators 109 and 110, the output from the inverter 111 goes low while the output from the comparator 110 goes high, and the output from the NAND gate 113 goes low, so that a voltage at the receiver output terminal 116 goes low. Then, when the receiver input voltage applied to the terminal 108 goes down and becomes lower than the high level threshold voltage $V_{IH}$ being applied to the inversion input terminal of the comparator 109, the output from the comparator 109 goes low and the output from the inverter 111 goes high, but as the output from the NAND gate 113 is kept low, also the voltage at the receiver output terminal 116 is kept low. When the receiver input voltage applied to the terminal 108 goes down still further and becomes lower than the low level threshold voltage ($V_{IL1}$ or $V_{IL2}$) applied to the inversion input terminal of the comparator 110, the output from the comparator 110 goes low while the output from the NAND gate 113 goes high, and the voltage at the receiver output terminal 116 goes high. When the receiver input voltage changes from low to high, similarly the receiver output inverts from high to low when the input voltage applied to the terminal 108 goes over the high threshold voltage $V_{IH}$ being applied to the inversion input terminal of the comparator 109. As described above, when the receiver input voltage changes from high to low, the receiver output changes from low to high at the low level threshold voltage ($V_{IL1}$ or $V_{IL2}$), and when the receiver input voltage changes from low to high, the receiver output changes from high to low at the high level threshold voltage $V_{IH}$ being applied to the inversion input terminal of the comparator 109. As the low level threshold voltage ($V_{IL1}$ or $V_{IL2}$) being applied to the inversion input terminal of the comparator 110 changes based on the input level at the threshold select terminal 104 as described above, the input threshold characteristics as shown in FIG. 2 are obtained. Accordingly, it is possible to easily select the input threshold characteristics having wide hysteresis width determined by $V_{IH}-V_{IL2}$ for transmitting a clock signal or the threshold characteristics having narrow hysteresis width, not including 0 V, determined by $V_{IH}-V_{IL1}$ for transmitting a control signal.

While the invention has been described in its preferred embodiment, it is to be understood that the words which have been used are words of description rather than limitation and that changes within the purview of the appended claims may be made without departing from the true scope and spirit of the invention in its broader aspects.

What is claimed is:

1. An RS-232C line receiver IC for digital data transmission through an electric cable, having hysteresis characteristics in changes of an output voltage with respect to an input voltage, and conforming to the RS-232C standards, said line receiver IC comprising:

a reference voltage generating circuit (4) having a high reference voltage generating means for producing a high reference voltage ($V_{IH}$), a first reference voltage generating means for producing a first low reference voltage ($V_{IL1}$) and a second reference voltage generating means for producing a second low reference voltage ($V_{IL2}$); all of the second low reference voltage ($V_{IL2}$), the first low reference voltage ($V_{IL1}$), and the high reference voltage ($V_{IH}$) being within a voltage range extending from $-3$ volts to $+3$ volts; the potential of said first reference voltage generating means being higher than ground potential, and the potential of said second low reference voltage produced by said second reference voltage generating means being lower than the ground potential;

a switching circuit (2) including a first switching means (2a) having a first input node and a first output node, said first input node being connected to said first reference voltage generating means, and a second switching means (2b) having a second input node and a second output node, said second input node being connected to said second reference voltage generating means;

a switch control circuit (3) which receives said high reference voltage and which selectively makes conductive either one of said first switching means (2a) or said second switching means (2b) depending on whether said input voltage is higher than said high reference voltage; and a hysteresis output circuit (1) having a first input terminal to which both the second output nodes of said first switching means (2a) and said second switching means (2b) are connected so as to selectively receive either said first low reference voltage or said second low reference voltage as a low input threshold voltage, a second input terminal to which said input voltage is applied, and a third input terminal which receives said high reference voltage as a high input threshold voltage from said high reference voltage generating means.

2. An RS-232C line receiver IC according to claim 1, in which said first switching means is formed by a PMOS FET and an NMOS FET connected in parallel with each other and said second switching means is formed by a PMOS FET and an NMOS FET connected in parallel with each other.

* * * * *